US012804863B2

(12) United States Patent
Li et al.

(10) Patent No.: US 12,804,863 B2
(45) Date of Patent: Nov. 17, 2026

(54) HEAT DISSIPATION SYSTEM AND SOLID-STATE TRANSFORMER POWER APPARATUS

(71) Applicant: DELTA ELECTRONICS, INC., Taoyuan City (TW)

(72) Inventors: Sheng-Hua Li, Taoyuan City (TW); Wei-Chi Lee, Taoyuan City (TW); Ming-Chen Yen, Taoyuan City (TW); Chun-Han Lin, Taoyuan City (TW)

(73) Assignee: DELTA ELECTRONICS, INC., Taoyuan City (TW)

( * ) Notice: Subject to any disclaimer, the term of this patent is extended or adjusted under 35 U.S.C. 154(b) by 270 days.

(21) Appl. No.: 18/502,930

(22) Filed: Nov. 6, 2023

(65) Prior Publication Data

US 2024/0237311 A1 Jul. 11, 2024

Related U.S. Application Data

(60) Provisional application No. 63/437,449, filed on Jan. 6, 2023.

(30) Foreign Application Priority Data

Jun. 15, 2023 (CN) ........................ 202310712663.5

(51) Int. Cl.
*H05K 7/20* (2006.01)

(52) U.S. Cl.
CPC ..... *H05K 7/20927* (2013.01); *H05K 7/20272* (2013.01); *H05K 7/20945* (2013.01)

(58) Field of Classification Search
CPC ........... H05K 7/20927; H05K 7/20272; H05K 7/20945
See application file for complete search history.

(56) References Cited

U.S. PATENT DOCUMENTS 9,250,636 B2 * 2/2016 Chainer .................. G06F 1/206
9,320,177 B2 * 4/2016 Levesque ............. H05K 7/2079
(Continued)

FOREIGN PATENT DOCUMENTS

CN 106463994 A 2/2017
CN 207083356 U 3/2018
(Continued)

OTHER PUBLICATIONS

Office Action dated May 8, 2024 of the corresponding Taiwan patent application No. 112122368.
(Continued)

*Primary Examiner* — Imani N Hayman
(74) *Attorney, Agent, or Firm* — MUNCY, GEISSLER, OLDS & LOWE, P.C.

(57) ABSTRACT

A heat dissipation is used to dissipate heat for a power module of an AC-to-DC conversion module. The heat dissipation system includes a chiller, a heat exchanger, a first circulation pipeline, a second circulation pipeline, a first throttle valve, and a control module. The chiller, the heat exchanger, and the first circulation pipeline form a first circulation loop to circulate a low-temperature coolant. The second circulation pipeline is disposed on one side of the power module to form a second circulation loop, and absorbs a heat source generated by the power module by circulating a high-temperature coolant. The control module opens the first throttle valve to introduce the low-temperature coolant into the second circulation loop based on a temperature of the high-temperature coolant being greater than a temperature threshold so as to control the temperature to be less than or equal to the temperature threshold.

5 Claims, 12 Drawing Sheets

(56) References Cited

U.S. PATENT DOCUMENTS

| | | | | |
|---|---|---|---|---|
| 9,706,689 | B2 * | 7/2017 | Levesque | H05K 7/20263 |
| 2013/0138253 | A1 * | 5/2013 | Chainer | H05K 7/20781<br>700/282 |
| 2016/0183408 | A1 | 6/2016 | Sutherland et al. | |
| 2017/0057369 | A1 | 3/2017 | Næsje et al. | |
| 2021/0378147 | A1 * | 12/2021 | Chehade | H05K 7/20927 |

FOREIGN PATENT DOCUMENTS

| | | | |
|---|---|---|---|
| CN | 108705956 | A | 10/2018 |
| CN | 111869041 | A | 10/2020 |
| CN | 112449549 | A | 3/2021 |
| CN | 216491806 | U | 5/2022 |
| CN | 217804367 | U | 11/2022 |
| WO | 2022079289 | A1 | 4/2022 |

OTHER PUBLICATIONS

Partial Search Report dated May 14, 2024 of the corresponding European patent application No. 23208514.2.

* cited by examiner

HEAT DISSIPATION SYSTEM AND SOLID-STATE TRANSFORMER POWER APPARATUS

CROSS-REFERENCE TO RELATED APPLICATION

This patent application claims the benefit of U.S. Provisional Patent Application No. 63/437,449, filed Jan. 6, 2023, which is incorporated by reference herein.

BACKGROUND

Technical Field

The present disclosure relates to a heat dissipation system and a solid-state transformer power apparatus, and more particularly to a heat dissipation system with high-efficiency heat dissipation manner and a solid-state transformer power apparatus.

Description of Related Art

The statements in this section merely provide background information related to the present disclosure and do not necessarily constitute prior art.

Please refer to FIG. 1, which shows a block circuit diagram of a conventional electric vehicle charging apparatus. In the known disadvantages of electric vehicle charging technology, the medium-voltage AC power source (MV-AC, that is, the three-phase input power source Pac_3) needs to be transformed by a traditional wire-wound low-frequency transformer (as a phase-shifting transformer T shown in FIG. 1). The wire-wound low-frequency transformer converts the medium-voltage AC power source into a low-voltage AC input power, and the low-voltage AC input power is provided to the AC-to-DC conversion module 10 for conversion so that the electric vehicle 500 is charged through the charging pile 3. Since the AC-to-DC conversion module 10 receives the AC power source (for example, the power is not limited to 220V, 380V, etc.) converted by the traditional phase-shifting transformer T, when the AC-to-DC conversion module 10 operates, inner power components (which are usually the main heating components) should be equipped with cooling fins, copper sheets, and other heat dissipation components to help the main heating elements dissipate heat so as to avoid excessive heat accumulation and damage to the power components.

However, when the electric vehicle charging apparatus uses a solid-state transformer (SST) structure, the AC-to-DC conversion module 10 needs to have the function of directly converting the three-phase input power source Pac_3 of the MV-AC. Therefore, the AC-to-DC conversion module 10 needs to use high-power power components for operation, which will inevitably cause the power components inside the AC-to-DC conversion module 10 to generate a greater amount of heat. Therefore, installing cooling components such as cooling sinks and copper sheets cannot effectively help the power components dissipate heat, and it is more likely to cause damage to them.

Therefore, the present disclosure is to design a heat dissipation system and a solid-state transformer power apparatus to effectively dissipate heat from the power components inside the solid-state transformer in the electric vehicle charging apparatus.

SUMMARY

In order to solve the above-mentioned problems, the present disclosure provides a heat dissipation system. The heat dissipation system dissipates heat for a power module of an AC-to-DC conversion module. The heat dissipation system includes a chiller, a heat exchanger, a first circulation pipeline, a second circulation pipeline, a first throttle valve, and a control module. The chiller provides a low-temperature coolant. The heat exchanger is coupled to the chiller, and exchanges heat between the low-temperature coolant and an airflow flowing through the power module. The first circulation pipeline is coupled to the heat exchanger and the chiller so that the chiller, the heat exchanger, and the first circulation pipeline form a first circulation loop to circulate the low-temperature coolant. The second circulation pipeline is disposed on one side of the power module to form a second circulation loop, and absorbs a heat source generated by the power module by circulating a high-temperature coolant. The first throttle valve is coupled between the first circulation loop and the second circulation loop. The control module is coupled to the first throttle valve, and opens the first throttle valve to introduce the low-temperature coolant into the second circulation loop based on a temperature of the high-temperature coolant being greater than a temperature threshold so as to control the temperature to be less than or equal to the temperature threshold.

In order to solve the above-mentioned problems, the present disclosure provides a solid-state transformer power apparatus. The solid-state transformer power apparatus includes a housing, a plurality of AC-to-DC conversion modules, and a heat dissipation system. The housing includes a housing block. The plurality of AC-to-DC conversion modules are disposed in the housing block, and each AC-to-DC conversion module includes a power module. The heat dissipation system dissipates heat for the power module, and the heat dissipation system includes a water cooling component and an air cooling component. The water cooling component provides a coolant to the power module to absorb a heat source generated by the power module. The air cooling component exchanges heat between the coolant and an airflow flowing through the power module.

The main purpose and effect of the present disclosure is that the heat dissipation system uses both the water cooling component and the air cooling component to work together to dissipate heat for the power module inside the solid-state transformer. Therefore, using the principle of heat exchange, the alternate application of cold and heat sources can be achieved, and the heat dissipation efficiency can be increased.

It is to be understood that both the foregoing general description and the following detailed description are exemplary, and are intended to provide further explanation of the present disclosure as claimed. Other advantages and features of the present disclosure will be apparent from the following description, drawings, and claims.

BRIEF DESCRIPTION OF DRAWINGS

The present disclosure can be more fully understood by reading the following detailed description of the embodiment, with reference made to the accompanying drawing as follows.

DETAILED DESCRIPTION

Figure 1:
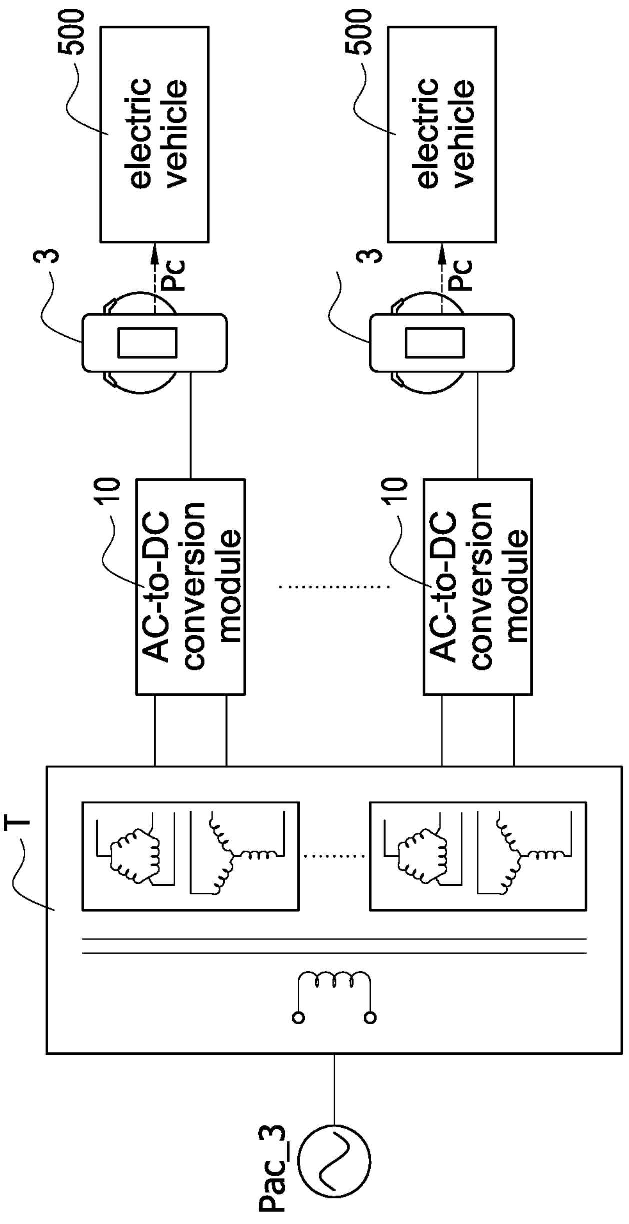
FIG.1 (related art)
FIG. 1 is a block circuit diagram of a conventional electric vehicle charging apparatus.

Reference will now be made to the drawing figures to describe the present disclosure in detail. It will be understood that the drawing figures and exemplified embodiments of present disclosure are not limited to the details thereof.

Figure 2:
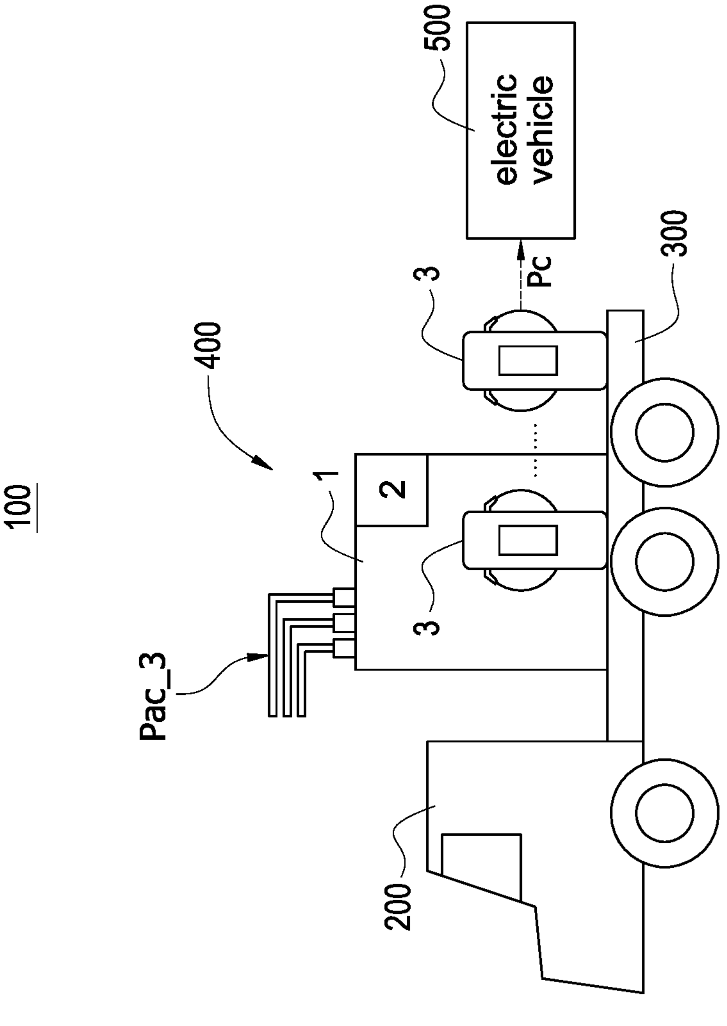
FIG. 2 is a schematic view of a mobile charging station with a solid-state transformer structure according to a first embodiment of the present disclosure.

Please refer to FIG. 2, which shows a schematic view of a mobile charging station with a solid-state transformer structure according to a first embodiment of the present disclosure. The mobile charging station is mainly applied to a combination truck 100. The combination truck 100 includes a tractor 200, a trailer 300, and an electric vehicle charging apparatus 400. The electric vehicle charging apparatus 400 is disposed on the trailer 300. The electric vehicle charging apparatus 400 includes a solid-state transformer (SST) power module 1 (hereinafter referred to as "SST power module"), a deployment module 2, and a plurality of charging piles (dispensers) 3. The SST power module is mainly a super-fast charging conversion module of converting a medium-voltage AC (MV-AC) power source into a DC power source. In one embodiment, the SST power module 1, the deployment module 2, and the plurality of charging piles 3 may preferably be fixed on the trailer 300 by means of locking, embedding, etc. In particular, the main application of SST is to use high-frequency power converters that can receive medium-voltage AC power source (MV-AC) to replace traditional large-volume power transformers (such as the traditional phase-shifting transformer shown in FIG. 1) to reduce the size of the system, increase the power density, improve the power factor and other efficiencies, and provide megawatt (megawatt) level power conversion (such as but not limited to 1 MW or more).

Figure 3A:
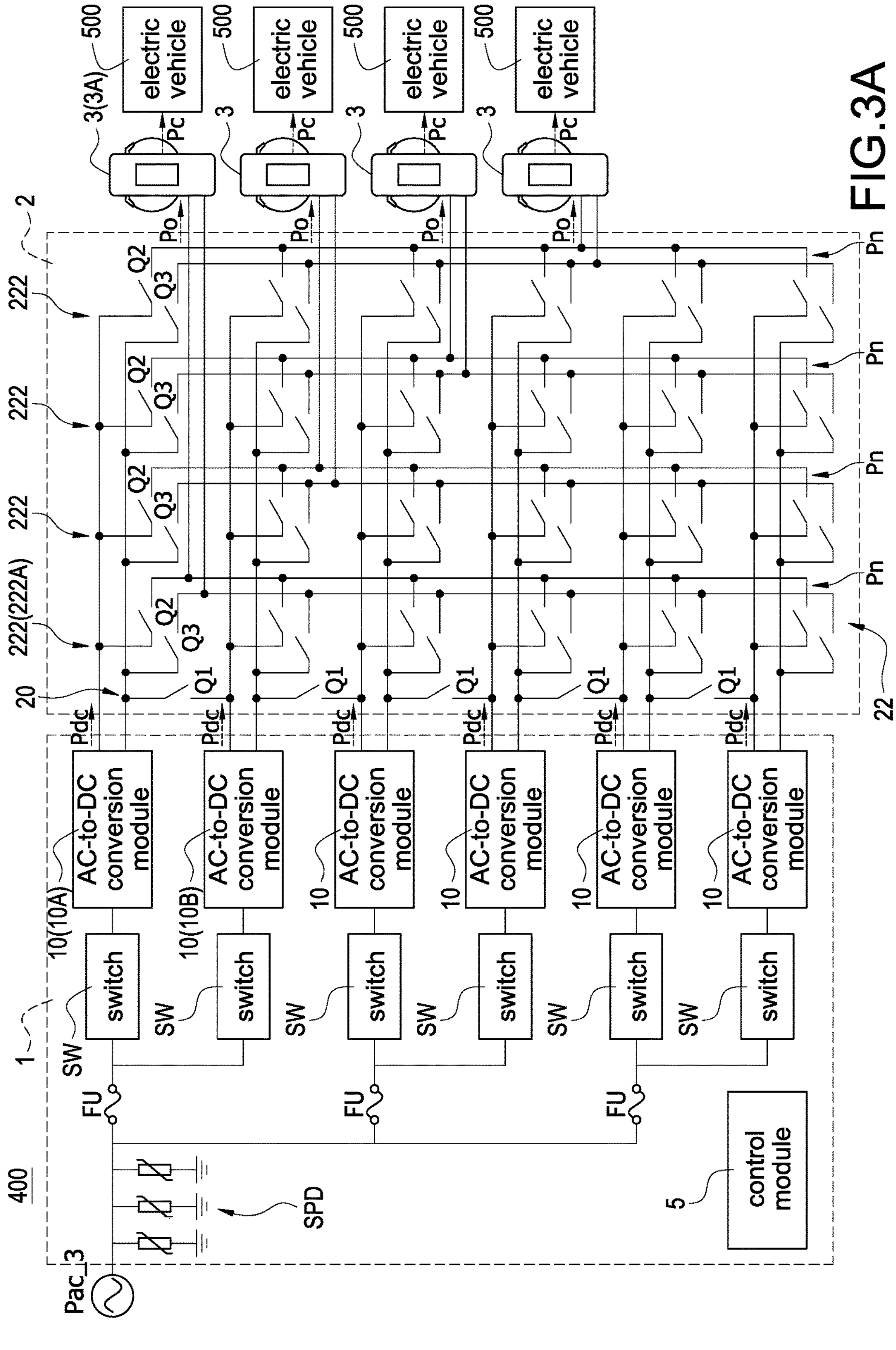
FIG. 3A is a block circuit diagram of an electric vehicle charging apparatus according to a first embodiment of the present disclosure.

Please refer to FIG. 3A, which shows a block circuit diagram of an electric vehicle charging apparatus according to a first embodiment of the present disclosure, and also refer to FIG. 2. The SST power module 1 receives the MV-AC, i.e., a three-phase input power source Pac_3, usually between 1 kV and 35 kV, and converts the input power source Pac_3 into a plurality of DC power sources Pdc. The deployment module 2 is coupled between the SST power module 1 and the plurality of charging piles 3, and the deployment module 2 provides a plurality of output power sources Po to the plurality of charging piles 3 based on the plurality of DC power sources Pdc. The plurality of charging piles 3 respectively receive the plurality of output power sources Po by coupling to the deployment module 2, and provide a plurality of charging power sources Pc based on the output power sources Po So that the plurality of charging piles 3 can provide the plurality of charging power sources Pc corresponding to the number of the electric vehicles 500 connected to the charging piles to charge the plurality of electric vehicles 500. Therefore, the plurality of charging piles 3 can provide appropriate voltage and current (i.e., appropriate power) to charge the plurality of electric vehicles 500 according to the requirements of the plurality of electric vehicles 500. When the mobile charging station arrives at the location, it only needs to connect the MV-AC (i.e., the three-phase input power source Pac_3) to charge the electric vehicle 500 that needs to be charged anytime and anywhere.

The SST power module 1 includes a plurality of AC-to-DC conversion modules 10. An input terminal of each AC-to-DC conversion module 10 receives the MV-AC (i.e., the three-phase input power source Pac_3), and the plurality of AC-to-DC conversion modules 10 convert the three-phase input power source Pac_3 into the plurality of DC power sources Pdc. An output terminal of each AC-to-DC conversion module 10 is coupled to the deployment module 2 so that the plurality of AC-to-DC conversion modules 10 respectively provide the plurality of DC power sources Pdc to the deployment module 2. On the other hand, the input terminal of each AC-to-DC conversion module 10 is coupled to a switch SW, which is a MV-AC switch, to provide a front-stage protection of each AC-to-DC conversion module 10. In particular, the MV-AC switch may be any type of relay, contactor, circuit breaker, semiconductor, and other components, as a power-off mechanism for a single AC-to-DC conversion module so that when a single isolated AC-to-DC converter fails, the power can be off without affecting the operation of other AC-to-DC conversion modules.

The deployment module 2 may be a matrix switch assembly, and the matrix switch assembly includes a first switch assembly 20 and a second switch assembly 22. The first switch assembly 20 includes a plurality of first switches Q1, and each first switch Q1 is coupled between a negative output end 10− of one of the plurality of AC-to-DC conversion modules 10 (for example, the AC-to-DC conversion module 10A) and a positive output end 10+ of another of the plurality of AC-to-DC conversion modules 10 (for example, the AC-to-DC conversion module 10B) so as to form the series-connected AC-to-DC conversion modules 10. Therefore, the first switch assembly 20 can connect the output ends of the plurality of AC-to-DC conversion modules 10 in series based on the voltage requirements of the plurality of electric vehicles 500, and the number of first switches Q1 is the number of the AC-to-DC conversion modules 10 minus one.

The second switch assembly 22 includes a plurality of switch rows 222, and each switch row 222 includes a plurality of second switches Q2 and a plurality of third switches Q3. The plurality of second switches Q2 make the plurality of positive output ends 10+ of the plurality of AC-to-DC conversion modules 10 be connected in parallel, and the plurality of third switches Q3 make the plurality of negative output ends 10− of the plurality of AC-to-DC conversion modules 10 be connected in parallel so that each switch row 222 forms a parallel-connected node Pn. One end of the second switch Q2 is coupled to the positive output end 10+ of the AC-to-DC conversion module 10, and the other end of the second switch Q2 is coupled to the parallel-connected node Pn so that the plurality of positive output ends 10+ of the plurality of AC-to-DC conversion modules 10 are coupled in parallel. The same is true for the third switch Q3, and therefore the plurality of negative output ends 10− of the plurality of AC-to-DC conversion modules 10 are coupled in parallel. Accordingly, the second switch assembly 22 can provide parallel connection for the plurality of AC-to-DC conversion modules 10 based on current demands of the plurality of electric vehicles 500. In particular, the number of the charging piles is corresponding to the number of the switch rows 222, and each charging pile 3 is correspondingly coupled to the parallel-connected node Pn of each switch row 222.

For example, it is assumed that the output voltage of each AC-to-DC conversion module 10 is 200V to 500V. Therefore, by operating the first switch assembly 20, two AC-to-DC conversion modules 10 are connected in series to achieve the output voltage of 400V to 1000V, and so on. For example, but not limited to, when the demand of the electric vehicle 500 is 500V, by operating the first switch assembly 20 to turn off all the plurality of first switch Q1, the output voltage of one AC-to-DC conversion module 10, i.e., 500V, is provided to the charging pile 3 for the electric vehicle 500. When the demand of the electric vehicle 500 is 1000V, by operating the first switch assembly 20 to turn on one of the pluralities of first switches Q1, the output voltage of two AC-to-DC conversion modules 10, i.e., 1000V, is connected in series and then provided to the charging pile 3 for the electric vehicle 500.

On the other hand, it is assumed that the output current of each AC-to-DC conversion module 10 is 250 A. Therefore, by operating the first switch assembly 20, three AC-to-DC conversion modules 10 are connected in parallel to achieve the output current of 750 A, and so on. Specifically, the first switch row 222A is corresponding to the first charging pile 3A. Based on the current demand of the electric vehicle 500 connected to the first charging pile 3A, one to six AC-to-DC conversion modules 10 (shown in FIG. 3A for example) can be used to charge the electric vehicle 500 connected to the first charging pile 3A. The rest of the switch rows 222 may be deduced in the same way, which will not be repeated here. Therefore, the number of the switch rows 222 to be used is determined based on the number of the charging piles 3. For example, but not limited to, when six charging piles 6 are used, six switch rows 222 are correspondingly used.

Furthermore, the deployment module 2 may be a matrix switch assembly to make the electric vehicle charging apparatus 400 have better energy scheduling capabilities. The number of the charging piles 3 is unrelated with the number of the AC-to-DC conversion modules 10, that is, the number of the charging piles 3 may be greater than or less than the number of the AC-to-DC conversion modules 10. The charging mechanism of the electric vehicle 500 is determined by controlling to turn on and turn off switches of the matrix switch assembly. Therefore, by turning on and turning off the switches of the matrix switch assembly, the control mechanisms such as which electric vehicle 500 can acquire a larger current, which electric vehicle 500 can be first charged, and which electric vehicle 500 can be first powered off can be determined. In one embodiment, the electric vehicle charging apparatus 400 includes a control module 5. The control module 5 may be a system controller, for example, but not limited to, a microprocessor, and it can be composed of at least one controller. The control module 5 can be used to control all operations of devices in the electric vehicle charging apparatus 400, such as but not limited to, turning on or turning off the switches of the matrix switch assembly, enabling or disabling the AC-to-DC conversion modules 10, and other devices described later can be controlled by the control module 5.

In one embodiment, in addition to being a matrix switch assembly the deployment module 2 may also be a power distribution unit (PDU) and other devices that also have a power-distributing function to distribute the DC power source Pdc as the output power source Po, instead of using the matrix switch assembly only. When the power conversion capability of a single AC-to-DC conversion module 10 is sufficient to cope with the rated charging capacity of a single charging pile 3, the deployment module 2 can be omitted, that is, the AC-to-DC conversion module 10 directly provides DC power source Pdc to the charging pile 3. Moreover, the circuit structure of the SST power module 1 shown in FIG. 3A is more suitable for a unidirectional power supply circuit structure, and has the characteristics of reactive power compensation and good performance of harmonic current under light-loading conditions. In particular, since the MV-AC (i.e., the three-phase input power source Pac_3) needs to be electrically isolated from the charging pile 3, in addition to an additional isolated transformer, it is a preferred implementation manner that the AC-to-DC conversion module 10 uses an isolated AC-to-DC converter. Moreover, since the output terminals of the plurality of AC-to-DC conversion modules 10 are respectively coupled to the deployment module 2, the plurality of charging piles 3 are electrically isolated from each other.

Moreover, the SST power module 1 may also optionally include a surge protection device SPD and a plurality of fuses FU. The surge protection device SPD is coupled to the three-phase input power source Pac_3, and the plurality of fuses FU are coupled between the surge protection device SPD and the plurality of switches SW. The surge protection device SPD is used to discharge the surge (for example, but not limited to, lightning strikes) to the ground or consume the surge when a surge occurs in the three-phase input power source Pac_3, thereby avoiding the failure of the back-end circuit due to the shock of the surge. In one embodiment shown in FIG. 3A, two AC-to-DC conversion modules 10 share one fuse FU to save the amount of the fuse FU. However, in practical applications, since the plurality of AC-to-DC conversion modules 10 are independent to each other, one fuse FU may also be configured at the input terminal of each AC-to-DC conversion module 10. Therefore, the fuse FU may be configured according to the actual requirements of the SST power module 1, and is not limited to FIG. 3A.

Figure 3B:
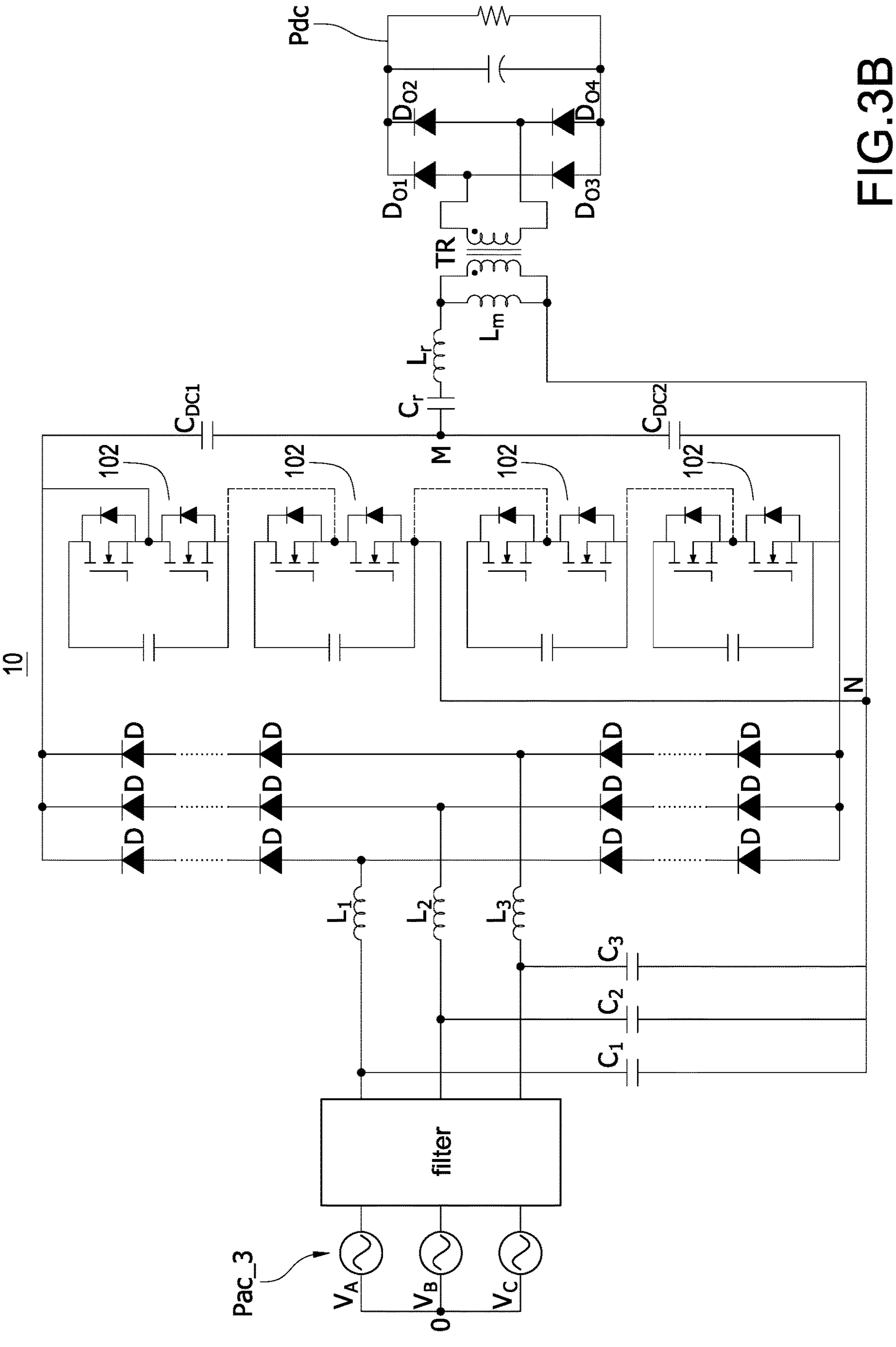
FIG. 3B is a block circuit diagram of an AC-to-DC conversion module according to the present disclosure.

Please refer to FIG. 3B, which shows a block circuit diagram of an AC-to-DC conversion module according to the present disclosure, and also refer to FIG. 2 to FIG. 3A. Since the AC-to-DC conversion module 10 in the SST power module 1 needs to have MV-AC conversion capability, the preferred implementation of the AC-to-DC conversion module 10 may include 2n half-bridge modules 102, and which can be expanded to even groups, such as six groups, eight groups, and so on according to actual requirements. The input terminal of the AC-to-DC conversion module 10 uses m diodes D coupled in series to withstand the medium-voltage three-phase input power source Pac_3. An isolated transformer TR is used to electrically isolate the MV-AC (i.e., the three-phase input power source Pac_3) from the charging pile 3 as well as power conversion. In particular, FIG. 3B only shows a preferred implementation of the AC-to-DC conversion module 10, and its circuit is not limited thereto. Any AC-to-DC conversion module with MV-AC conversion capability should be included in the scope of this embodiment.

Figure 3C:
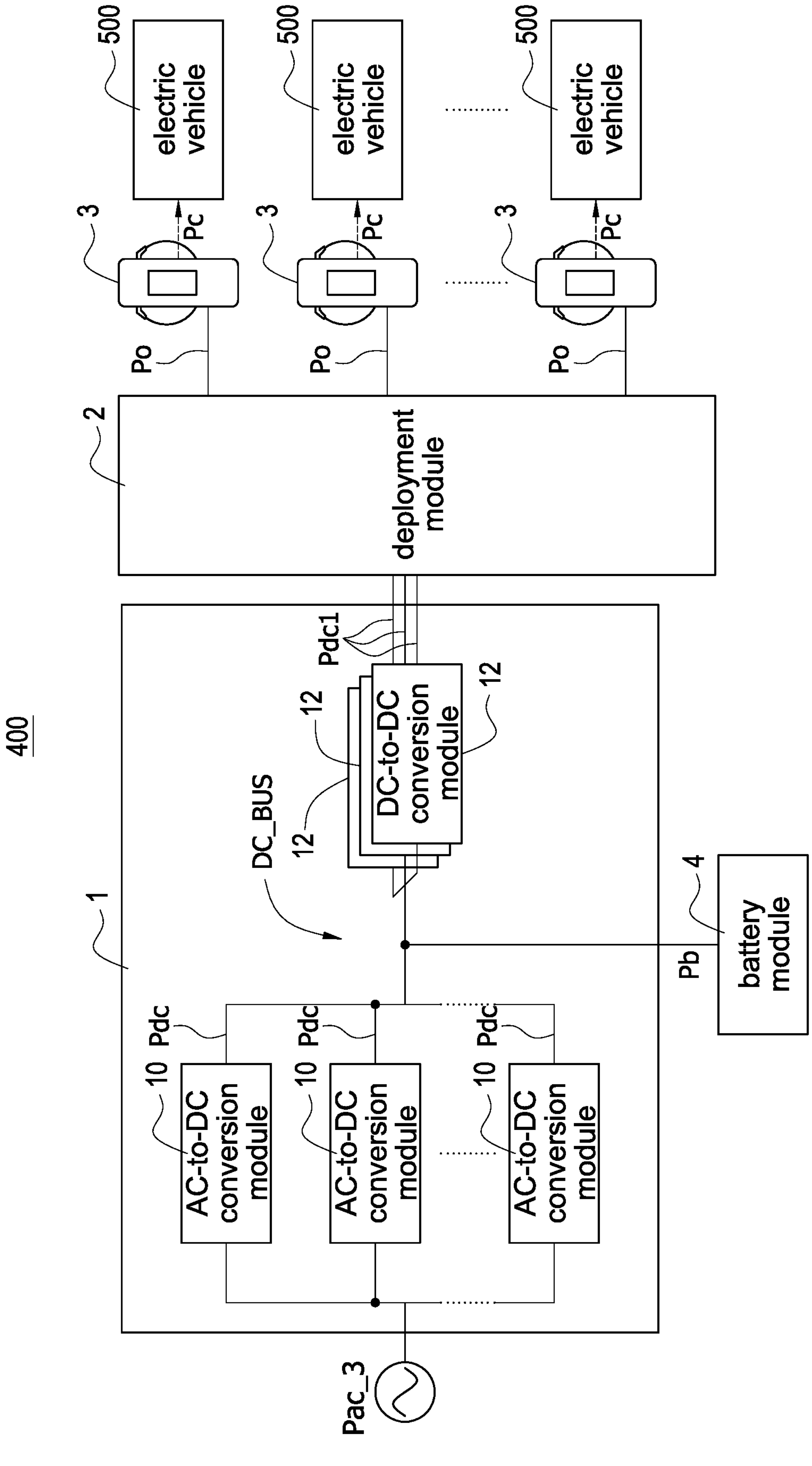
FIG. 3C is a block circuit diagram of the electric vehicle charging apparatus with a DC bus according to a first embodiment of the present disclosure.

Please refer to FIG. 3C, which shows a block circuit diagram of the electric vehicle charging apparatus with a DC bus according to a first embodiment of the present disclosure, and also refer to FIG. 2. In FIG. 3C, the SST power module 1 further includes a DC bus DC_BUS and a plurality of DC-to-DC conversion modules 12. The DC bus DC_BUS is coupled to the plurality of AC-to-DC conversion modules 10 to receive the plurality of DC power sources Pdc. The plurality of DC-to-DC conversion modules 12 are coupled to the DC bus DC_BUS and convert the power source on the DC bus DC_BUS into a plurality of first DC power sources Pdc1, and the plurality of first DC power sources Pdc1 are provided to the deployment module 2 according to the circuit structure shown in FIG. 3A. Therefore, the plurality of first DC power sources Pdc1 are associated with the plurality of DC power sources Pdc so that the deployment module 2 can provide a plurality of output power sources Po based on the plurality of DC power sources Pdc. In particular, the number of the DC-to-DC conversion modules 12 may be different from the number of the AC-to-DC conversion modules 10.

Moreover, the function of adding the DC bus DC_BUS to the SST power module 1 is that the electric vehicle charging apparatus 400 can additionally use the battery module 4. Specifically, the battery module 4 (such as, but not limited to, energy storage devices such as battery cabinets) can provide energy storage power Pb to the DC bus DC_BUS by being coupled to the DC bus DC_BUS. When the SST power module 1 is equipped with the battery module 4, the battery module 4 can be connected to the DC bus DC_BUS together with the plurality of AC-to-DC conversion modules 10 to provide the energy storage power Pb to the DC bus DC_BUS for backup power supply. Therefore, the plurality of DC-to-DC conversion modules 12 can convert the power (the plurality of DC power sources Pdc and/or the energy storage power Pb) on the DC bus DC_BUS into the plurality of first DC power sources Pdc1.

In one embodiment, since the plurality of charging piles 3 need to be electrically isolated from each other, in addition to an additional isolated transformer, it is a preferred implementation manner that the DC-to-DC conversion module 12 uses an isolated DC-to-DC converter. Moreover, since the MV-AC (i.e., the three-phase input power source Pac_3) needs to be electrically isolated from the DC bus DC_BUS, in addition to an additional isolated transformer, it is a preferred implementation manner that the AC-to-DC conversion module 10 uses an isolated AC-to-DC converter.

Therefore, as the above-mentioned description in FIG. 3A to FIG. 3C, the SST power module 1 based on the circuit structure of the plurality of AC-to-DC conversion modules 10 can be compatibly applied to the electric vehicle charging apparatus 400. By using the plurality of AC-to-DC conversion modules 10 and the matrix switch assembly, various charging specifications can be configured to meet the application requirements. The outputs of the plurality of AC-to-DC conversion modules 10 can provide different voltage/current specifications through the matrix switch assembly so as to meet the charging requirements of the plurality of electric vehicles 500 with different specifications.

Figure 4:
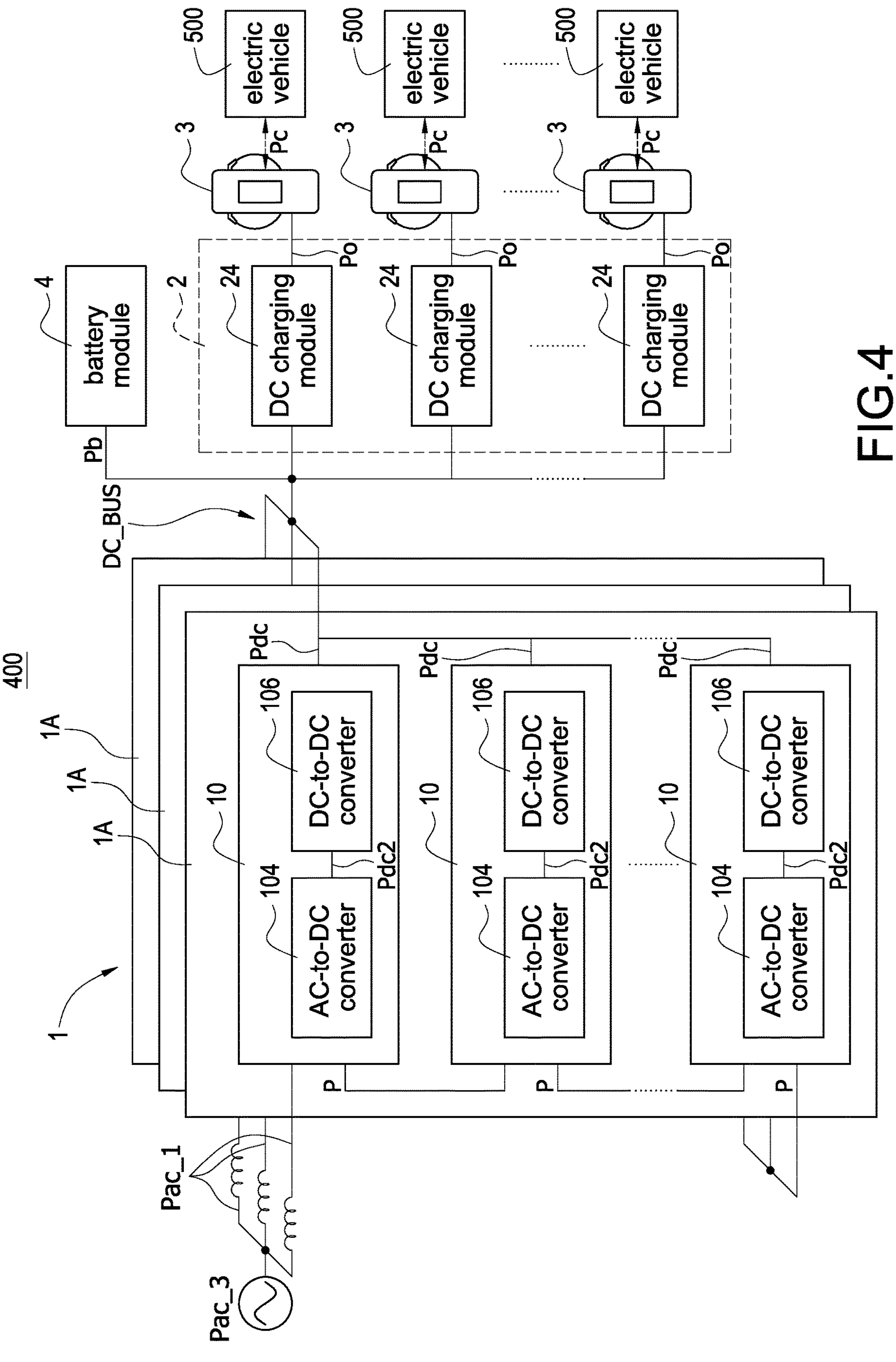
FIG. 4 is a block circuit diagram of the electric vehicle charging apparatus according to a second embodiment of the present disclosure.

Please refer to FIG. 4, which shows a block circuit diagram of the electric vehicle charging apparatus according to a second embodiment of the present disclosure, and also refer to FIG. 2 to FIG. 3C. The difference between FIG. 4 and FIG. 3A is that the SST power module 1 includes three SST power units 1A, and the electric vehicle charging apparatus 400 further a DC bus DC_BUS. The three SST power units 1A respectively receive three single-phase input power sources Pac_1 of the three-phase input power source Pac_3 so that each SST power unit 1A converts the single-phase input power source Pac_1 into a plurality of DC power sources Pdc. The DC bus DC_BUS is coupled between the three SST power units 1A and the deployment module 2 to receive the plurality of DC power sources Pdc, and the deployment module 2 converts the power on the DC bus DC_BUS into the plurality of output power sources Po.

Specifically, the three SST power units 1A respectively include a plurality of AC-to-DC conversion modules 10. The input terminals of the plurality of AC-to-DC conversion modules 10 are coupled in series to share the single-phase input power source Pac_1. As shown in FIG. 4, it is indicated by a plurality of input sources P, and the sum of the plurality of input sources P is the single-phase input power source Pac_1, and the input voltage is also the same. The output terminals of the plurality of AC-to-DC conversion modules 10 are coupled in parallel, and the output terminals of the three SST power units 1A are commonly connected to the DC bus DC_BUS. Each AC-to-DC conversion module 10 includes an AC-to-DC converter 104 and a DC-to-DC converter 106. The AC-to-DC converter 104 is coupled to the input terminal, and converts the power source shared at the input terminal (i.e., the input source P) into the second DC power source Pdc2. The DC-to-DC converter 106 is coupled to the AC-to-DC converter 104 and the DC bus DC_BUS, and converts the second DC power source Pdc2 into the DC power source Pdc and provides the DC power source Pdc to the DC bus DC_BUS.

The deployment module 2 includes a plurality of DC charging modules 24, and a plurality of first ends of the plurality of DC charging modules 24 are commonly connected to the DC bus DC_BUS. A plurality of second ends of the plurality of DC charging modules 24 are coupled to the plurality of charging piles 3. In particular, the number of the DC charging modules 24 is corresponding to the number of the charging piles 3. The DC charging module 24 receives the power on the DC bus DC_BUS and converts the power into the output power source Po. Since the electric vehicle charging apparatus 400 further includes the DC bus DC_BUS, the battery module 4 (such as, but not limited to, energy storage devices such as battery cabinets) can provide energy storage power Pb to the DC bus DC_BUS by being coupled to the DC bus DC_BUS. When the SST power module 1 is equipped with the battery module 4, the battery module 4 can be connected to the DC bus DC_BUS together with the plurality of DC-to-DC converters 106 to provide the energy storage power Pb to the DC bus DC_BUS for backup power supply. Therefore, the plurality of DC charging modules 24 can convert the power (the plurality of DC power sources Pdc and/or the energy storage power Pb) on the DC bus DC_BUS into the plurality of output power source Po. In particular, the circuit structure and operation manner not illustrated in FIG. 4 are the same as those in FIG. 3A to FIG. 3C, and the features in FIG. 3A to FIG. 4 may be applied to each other, and will not be repeated here.

In one embodiment, the circuit structure of the SST power module 1 shown in FIG. 4 is more suitable for a bidirectional power supply circuit structure, and has the characteristics of reactive power compensation and good performance of harmonic current under light-loading conditions. Moreover, since the MV-AC (i.e., the single-phase input power source Pac_1) needs to be electrically isolated from the DC bus DC_BUS, in addition to an additional isolated transformer, it is a preferred implementation manner that the DC-to-DC converter 106 uses an isolated DC-to-DC converter. In addition, since the plurality of charging piles 3 need to be electrically isolated from each other, in addition to an additional isolated transformer, it is a preferred implementation manner that the DC charging module 24 uses an isolated DC charger.

Please refer to FIG. 2 to FIG. 4 again, since the weight and volume of the SST power module 1 are much smaller than the traditional phase-shifting transformer shown in FIG. 1, even if the SST power module 1, the deployment module 2, and the plurality of (such as but not limited to, 20 to 30) charging piles 3 are all disposed on the trailer 300, the specification of the trailer 300 may still be reduced to less than or equal to a 10-foot cabinet to constitute the mobile charging station. That is, the specification of the combination truck 100 may be the minimum specification, and the tractor 200 with a smaller power specification is used to cooperate the trailer 300 with a smaller specification. Accordingly, the construction cost of the entire mobile charging station can be reduced, the size of the combination truck 100 can also be reduced, and its configuration can be more flexible, and therefore it is especially suitable for crossing narrow mountain roads or roads where roads are reduced due to landslides.

Figure 5A:
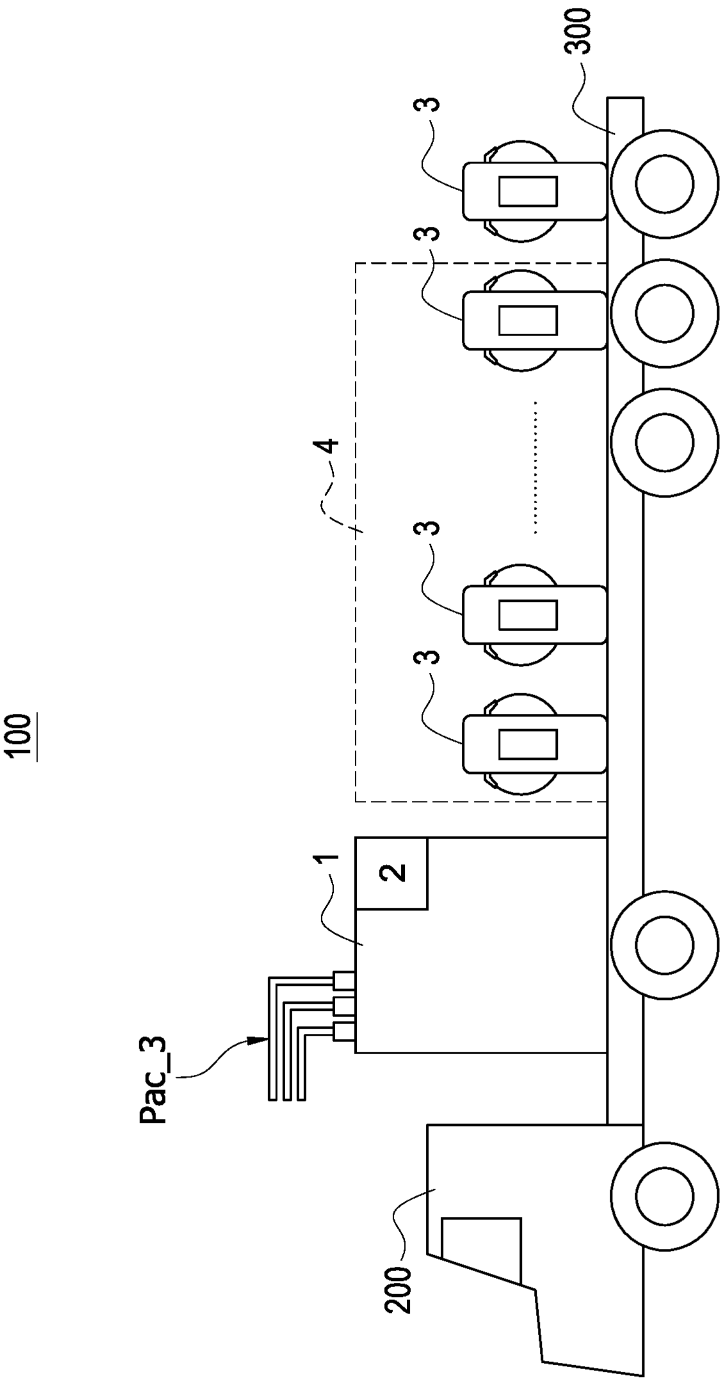
FIG. 5A is a schematic view of the mobile charging station with the solid-state transformer structure according to a second embodiment of the present disclosure.

Please refer to FIG. 5A, which shows a schematic view of the mobile charging station with the solid-state transformer structure according to a second embodiment of the present disclosure, and also refer to FIG. 2 to FIG. 4. The difference between FIG. 5A and FIG. 2 is that the electric vehicle charging apparatus 400 further includes the battery module 4 as shown in FIG. 3C and FIG. 4, and the battery module 4 is disposed on the trailer 300. Specifically, since the weight and volume of the SST power module 1 are smaller than an ultra-high-capacity battery cabinet (i.e., the battery module 4) or a transitional fast charging solution (i.e., the phase-shifting transformer), if there is excess passenger space and capacity on the trailer 300 (as shown in FIG. 5A), a battery cabinet with a small or medium capacity (i.e., the battery module 4) may be selectively installed to reduce the impact on the local power grid. In addition, if the tractor 200 is also an electric vehicle, the power source of the tractor 200 may also be supplemented by the battery module 4 to increase the battery life of the mobile charging station and make it more accessible to remote mountainous areas.

Figure 5B:
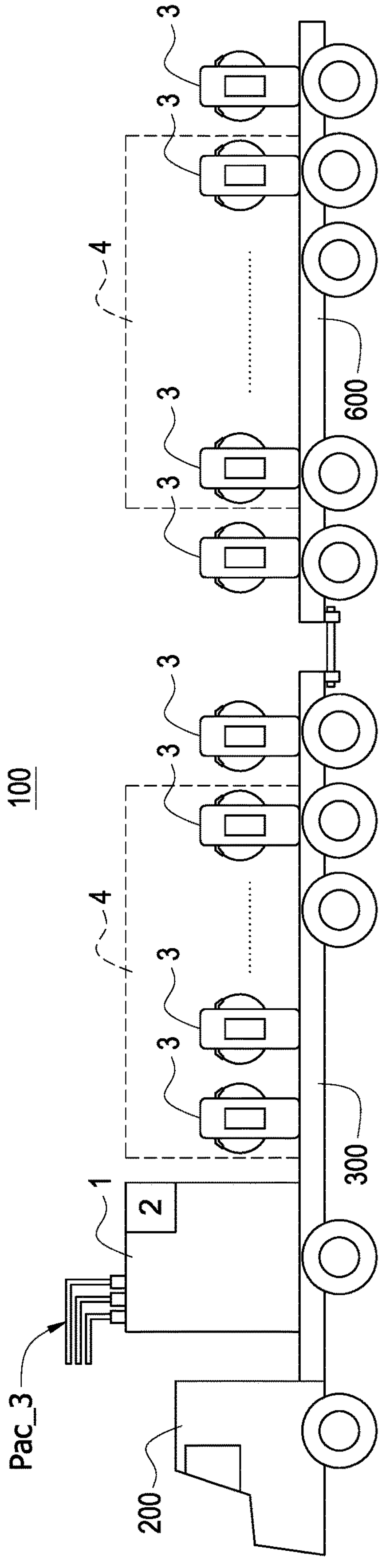
FIG. 5B is a schematic view of the mobile charging station with the solid-state transformer structure according to a third embodiment of the present disclosure.
Figure 5C:
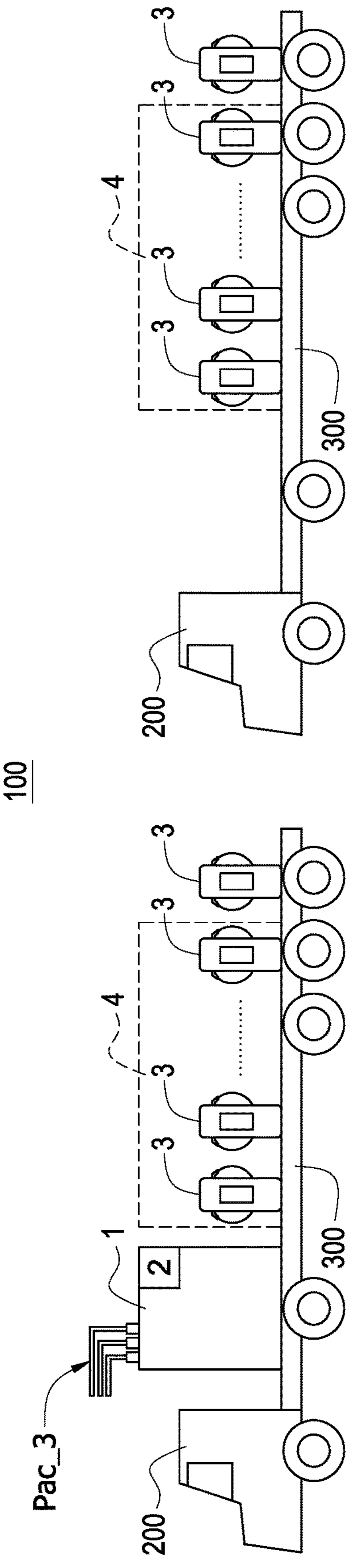
FIG. 5C is a schematic view of the mobile charging station with the solid-state transformer structure according to a fourth embodiment of the present disclosure.

Please refer to FIG. 5B, which shows a schematic view of the mobile charging station with the solid-state transformer structure according to a third embodiment of the present disclosure; please refer to FIG. 5C, which shows a schematic view of the mobile charging station with the solid-state transformer structure according to a fourth embodiment of the present disclosure, and also refer to FIG. 2 to FIG. 5A. The difference between FIG. 5B and FIG. 2 is that the mobile charging station further includes an extended trailer 600, and the battery module 4 as shown in FIG. 3C and FIG. 4. The extended trailer 600 is connected to the trailer 300, and the battery module 4 is disposed on the extended trailer 600. The difference between FIG. 5C and FIG. 2 is that the mobile charging station includes a plurality of combination trucks 100, and at least one of the combination trucks 100 includes the SST power module 1 and at least two of the combination trucks 100 include the battery module 4. Specifically, since the SST power module 1 has good expandability, when there is a need for a higher charging capacity, a plurality of combination trucks 100 may be connected in series or directly add a trailer (i.e., an extended trailer 600) to connect so as to carry more charging piles 3 or battery cabinets (i.e., the battery modules 4), or even directly add one SST power module 1. Therefore, it is to maximize the benefits of customers based on a variety of configuration options to meet the needs of various markets.

Figure 6:
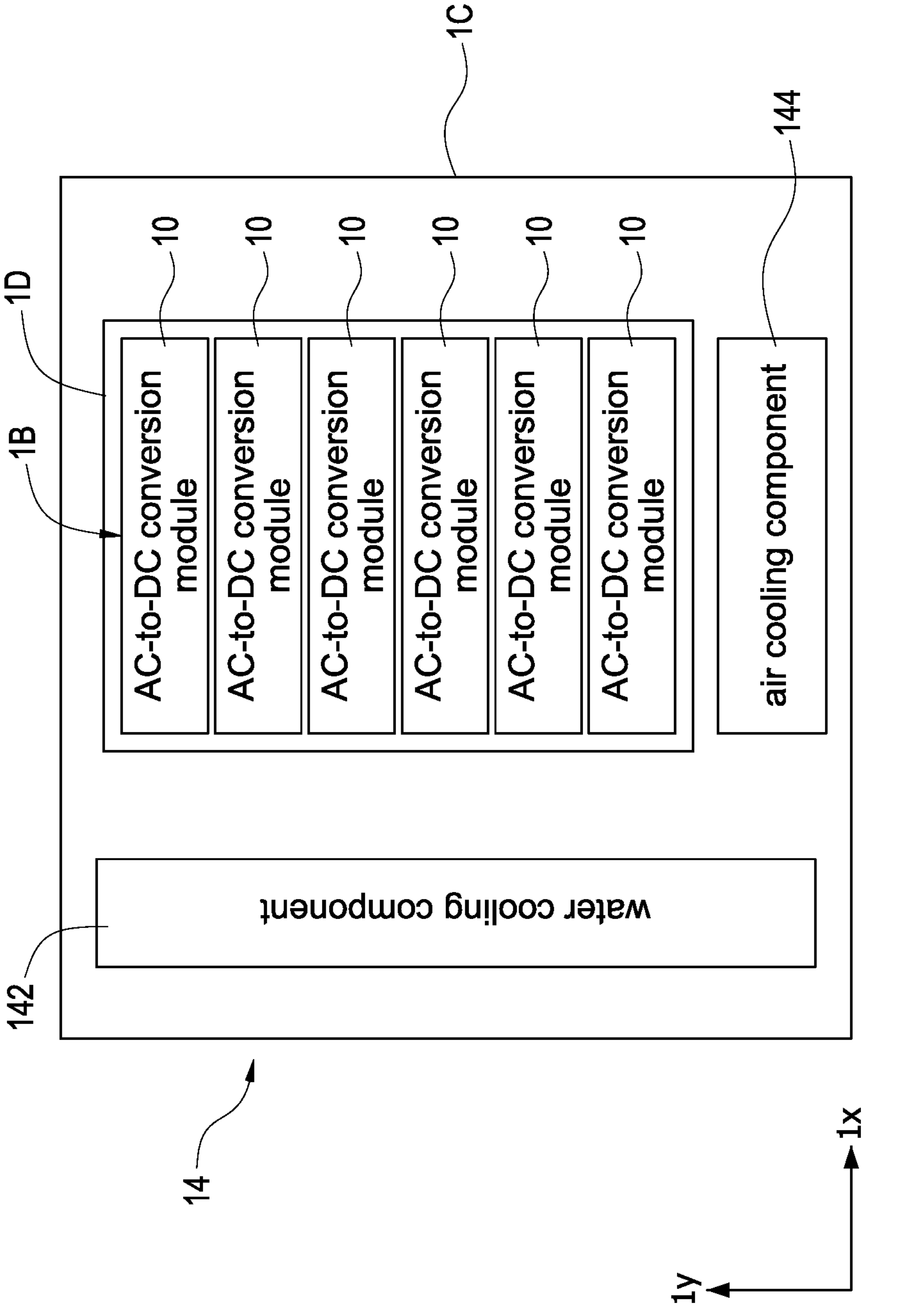
FIG. 6 is a schematic view of an SST power module with a heat dissipation system according to the present disclosure.

On the other hand, since the SST power module 1 needs to use high-power power components to operate to convert the MV-AC (i.e., the three-phase input power source Pac_3), it is necessary to use a high-efficient heat dissipation manner to dissipate heat from the power components. Therefore, the present designs a high-efficiency heat dissipation manner for the SST power module 1, which mainly uses water cooling and air cooling for circulation to effectively dissipate the heat generated by the power components. Please refer to FIG. 6, which shows a schematic view of an SST power module with a heat dissipation system according to the present disclosure, and also refer to FIG. 2 to FIG. 5C. In FIG. 6, the SST power module 1 as shown in FIG. 3A to FIG. 3C is illustrated, or the SST power unit 1A as shown in FIG. 4 is illustrated, hereinafter referred to as SST power apparatus 1B.

The SST power apparatus 1B includes a housing 1C, a plurality of AC-to-DC conversion modules 10 (shown in six modules), and a heat dissipation system 14. The interior of the housing 1C includes a housing block 1D, and the plurality of AC-to-DC conversion modules 10 are disposed in the housing block 1D. The heat dissipation system 14 is disposed in the housing 1C and outside the housing block 1D. The heat dissipation system 14 is mainly used to execute the heat dissipation for power modules, such as the half-bridge modules 102, which are the main heating elements, of the AC-to-DC conversion module 10 shown in FIG. 3B. The heat dissipation system 14 includes a water cooling component 142 and an air cooling component 144. The water cooling component 142 is used to provide cooling fluid to flow through the power modules to absorb heat generated by the power modules. The air cooling component 144 is used to exchange heat between the coolant and the airflow flowing through the power modules so as to jointly dissipate heat on the power modules together with the water cooling component 142. Therefore, using the principle of heat exchange, the alternate application of cold and heat sources can be achieved, and the heat dissipation efficiency can be increased.

Preferably, the water cooling component 142 and the air cooling component 144 are respectively disposed on a vertical side 1*y* and a horizontal side 1*x* of the housing block 1D. That is, the water cooling component 142 and the air cooling component 144 are arranged vertically. When the water cooling component 142 is arranged on the left side or the right side of FIG. 6, the air cooling component 144 is arranged on the upper side or the lower side of FIG. 6, and vice versa. Therefore, the water cooling component 142 and the air cooling component 144 are less likely to interact with each other during operation so that the heat dissipation efficiency can be further increased.

Figure 7:
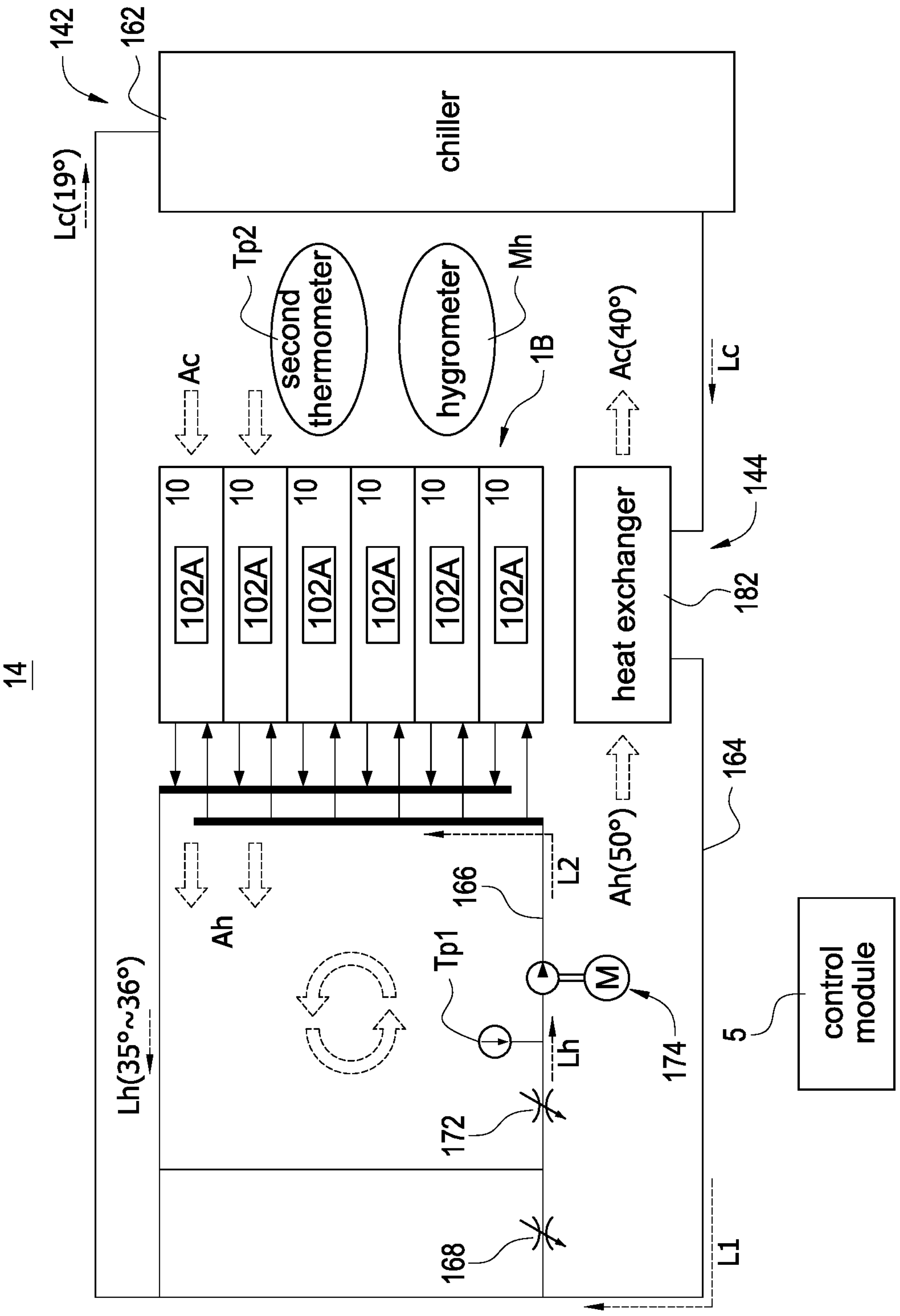
FIG. 7 is a block circuit diagram of the heat dissipation system and power modules according to the present disclosure.

Please refer to FIG. 7, which shows a block circuit diagram of the heat dissipation system and power modules according to the present disclosure, and also refer to FIG. 2 to FIG. 5C. The heat dissipation system 14 includes a chiller 162, a heat exchanger 182, a first circulation pipeline 164, a second circulation pipeline 166, a first throttle valve 168, and a control module 5. The chiller 162, the first circulation pipeline 164, the second circulation pipeline 166, and the first throttle valve 168 belong to the water cooling component 142, and the heat exchanger 182 belongs to the air cooling component 144.

The chiller 162 is used to provide low-temperature coolant Lc, and the heat exchanger 182 is coupled to the chiller 162 to exchange the low-temperature coolant Lc and the airflow flowing through the power modules 102A of the AC-to-DC conversion module 10. The first circulation pipeline 164 is coupled to the heat exchanger 182 and the chiller 162 so that the chiller 162, the heat exchanger 182, and the first circulation pipeline 164 form a first circulation loop L1 to circulate the low-temperature coolant Lc. The second circulation pipeline 166 is disposed on one side of the power modules 102A to form a second circulation loop L2, and absorbs heat generated by the power modules 102A by circulating high-temperature coolant Lh. The first throttle valve 168 is coupled between the first circulation loop L1 and the second circulation loop L2, and the control module 5 is coupled to the first throttle valve 168. Based on the fact that the temperature of the high-temperature coolant Lh is greater than a temperature threshold, the control module 5 opens the first throttle valve 168 to introduce the low-temperature coolant Lc into the second circulation loop L2 so as to mix the low-temperature coolant Lc into the high-temperature coolant Lh and control the temperature to be less than or equal to the temperature threshold.

Moreover, the first circulation loop L1 is an outer circulation loop, and the second circulation loop L2 is a semi-closed inner circulation loop as shown in FIG. 7. The low-temperature coolant Lc is outputted from the chiller 162 (for example, but not limited to 18 degrees Celsius), and flows back to the chiller 162 (for example, but not limited to 19 degrees Celsius) through the heat exchanger 182 and the outer circulation loop. The semi-closed inner circulation loop mainly flows the high-temperature coolant Lh (such as but not limited to 35 degrees Celsius) through the surrounding environment of the power modules 102A so as to absorb and carry out the heat of the surrounding environment of the power modules 102A. When the temperature of the high-temperature coolant Lh is less than or equal to the temperature threshold (such as but not limited to 35 Celsius), the semi-closed inner circulation loop is formed into a closed loop by closing the first throttle valve 168, and therefore the high-temperature coolant Lh continuously absorbs the heat of the surrounding environment of the power modules 102A in the closed loop. In particular, the coolant is, for example but not limited to, liquid conduction medium such as refrigerant, water, etc., but the refrigerant is preferred.

When the temperature of the high-temperature coolant Lh is greater than the temperature threshold (such as but not limited to 38 degrees Celsius), by opening the first throttle valve 168, the low-temperature coolant Lc can be mixed into the high-temperature coolant Lh to reduce the temperature of the high-temperature coolant Lh so as to maintain the heat absorption efficiency of the high-temperature coolant Lh. Therefore, when the temperature of the high-temperature coolant Lh in the inner circulation loop is too high, the first throttle valve 168 of the control module 5 is opened to maintain the coolant in the inner circulation loop within a specific temperature range (i.e., 35-38 degrees Celsius). Preferably, the first circulation loop L1 may be coupled to the second circulation loop L2 through two branches. One of the two branches includes the first throttle valve 168, and the other branch is used to guide the high-temperature coolant Lh to the outer circulation loop. The reason why it is preferable to configure two branches is that when the first throttle valve 168 is opened, in order to increase the exchange rate of the coolant, it is necessary to keep the coolant one enter (in) and one exit (out) so that the low-temperature coolant Lc can pass through the first throttle valve 168 and enter the second circulation loop L2 to be mixed with high-temperature coolant Lh, and guide the high-temperature coolant Lh to the outer circulation loop through the other branch. If there is no such two-branch design, even if the first throttle valve 168 is opened, the single branch will cause the low-temperature coolant Lc to mix with the high-temperature coolant Lh, but the coolant in the first circulation loop L1 and the second circulation loop L2, which is difficult to flow in and out in between to mix well. In one embodiment, if the two-branch circulation is configured, the first throttling valve 168 may be installed in both two branches so that it can control the low-temperature coolant Lc and the high-temperature coolant Lh to simultaneously flow in and out so that it has better circulation ability.

Also refer to FIG. 7, the water cooling component 142 further includes a second throttle valve 172, a hydraulic pump 174, and a first thermometer Tp1. The second throttle valve 172, the hydraulic pump 174, and the first thermometer Tp1 are coupled to the second circulation pipeline 166 and the control module 5. The control module 5 may detect the temperature of the high-temperature coolant Lh through the first thermometer Tp1 to control the first throttle valve 168, the second throttle valve 172, and the hydraulic pump 174 based on the temperature of the high-temperature coolant Lh. Specifically, the control module 5 may adjust the flow amount of the high-temperature coolant Lh by controlling the opening degree of the second throttle valve 172, and adjust the flow speed of the high-temperature coolant Lh by controlling the rotation speed of the hydraulic pump 174.

Therefore, the control module 5 may adjust the flow amount and flow speed of the semi-closed inner circulation loop by controlling the second throttle valve 172 and the hydraulic pump 174 to regulate the temperature rise rate and heat absorption efficiency of the high-temperature coolant Lh.

Moreover, the first throttle valve 168 is an adjustable throttle valve, and the control module 5 may adjust the flow amount of the low-temperature coolant Lc entering the second circulation loop L2 by controlling the opening degree of the first throttle valve 168. Therefore, the first throttle valve 168 and the second throttle valve 172 can work together. When the temperature of the high-temperature coolant Lh is less than or equal to the temperature threshold (such as but not limited to 38 degrees Celsius), the control module 5 decreases the opening degree of the first throttle valve 168 and that of the second throttle valve 172 to decrease the flow amount of the low-temperature cooling Lc entering the second circulation loop L2. Conversely, when the temperature of the high-temperature coolant Lh is greater than the temperature threshold, the control module 5 increases the opening degree of the first throttle valve 168 and that of the second throttle valve 172 to increase the flow amount of the low-temperature coolant Lc entering the second circulation loop L2. In this way, a better temperature regulation can be achieved.

On the other hand, as shown in FIG. 6 and FIG. 7, the heat exchanger 182 is disposed on the vertical side 1*y* or the horizontal side 1*x* of the housing block 1D (disposed below the vertical side 1*y* for illustration), and the heat exchange of the airflow in the heat exchanger 182 forms a high-temperature airflow Ah and a low-temperature airflow Ac. The high-temperature airflow Ah is inhaled by an air inlet of the heat exchanger 182, and is cooled to the low-temperature airflow Ac by the first circulation loop L1 at an air outlet of the heat exchanger 182. Based on the effect of fluid mechanics, the low-temperature airflow Ac blows through the air inlet of the SST power apparatus 1B to the air outlet of the module to take away the heat generated by the power modules 102A and form the high-temperature airflow Ah. Finally, the high-temperature airflow Ah returns to the air inlet of the heat exchanger 182 for circulation. Therefore, through the water cooling component 142 and the air cooling component 144 of the present disclosure to jointly dissipate heat from the power modules 102A, and make them share components so that the effect of increasing heat dissipation efficiency can be achieved.

As shown in FIG. 7, the heat dissipation system 14 further includes a second thermometer Tp2 and a hygrometer Mh. The second thermometer Tp2 is coupled to the control module 5 and detects the temperature of the airflow around the power modules 102A. The hygrometer Mh is coupled to the control module 5 and detects the humidity of the airflow around the power modules 102A. The control module 5 calculates a dew point temperature based on the airflow temperature and the airflow humidity, and adjusts the temperature range of the high-temperature coolant Lh based on the dew point temperature. Moreover, the heat dissipation system 14 of the present disclosure is also equipped with the function of preventing condensation. The dew point is the temperature the air needs to be cooled to (at constant pressure) in order to achieve a relative humidity (RH) of 100%. Different hot and cold conditions between the water cooling component 142 and the air cooling component 144 will occurs condensation on the pipeline surface of the water cooling component 142. This kind of condensation will occur around the power modules 102A due to the phenomenon of exchange between the coolant and the airflow, and therefore it is easy to generate condensation on the pipeline surface of the second circulation pipeline 166 around the power modules 102A. Therefore, the present disclosure can install the second thermometer Tp2 and the hygrometer Mh in the surrounding environment of the power modules 102A so that the control module 5 can adjust the temperature range of the high-temperature coolant Lh to be above the dew point temperature (for example, but not limited to, adjusting 35-38 degrees Celsius to 36-38 degrees Celsius) based on the monitored and calculated dew point temperature in real time or the control logic written in the system, thereby avoiding the situation that the air contacts the pipe wall of the relatively low-temperature second circulation pipeline 166 to condense.

Therefore, the heat dissipation system 14 of the present disclosure is a waterway/airway design based on heat management. When there are more than two kinds of heat sources in the waterway and each requires different water temperatures, the first throttle valve 168, the second throttle valve 172, the first thermometer Tp1, the second thermometer Tp2, the hygrometer Mh, and the hydraulic pump 174 may construct one or more temperature-controllable semi-closed inner circulation loops controlled by throttle valves 168, 172. According to the principle of using the self-heating of the component to heat the water temperature and the thermometer in the inner circulation loop, when the temperature of the high-temperature coolant Lh has not reached the target temperature, the first throttle valve 168 may be kept closed or the opening degree of the first throttle valve 168 may be decreased. Also, the hydraulic pump 174 of the inner circulation loop is continuously operated, and the flow amount of the coolant in the inner circulation loop is controlled by the second throttle valve 172. When the temperature of the high-temperature coolant Lh reaches the target temperature control point (i.e., the temperature threshold), the first throttle valve 168 is opened or the opening degree of the first throttle valve 168 is increased to introduce a relatively lower-temperature low-temperature coolant Lc so as to maintain the temperature of the high-temperature coolant Lh in the inner circulation loop within a specific temperature range. The first throttle valve 168 and the second throttle valve 172 may adjust the flow speed and flow amount of the low-temperature coolant Lc entering the inner circulation loop according to the control logic and the current working condition (for example, component heating condition).

Figure 8:
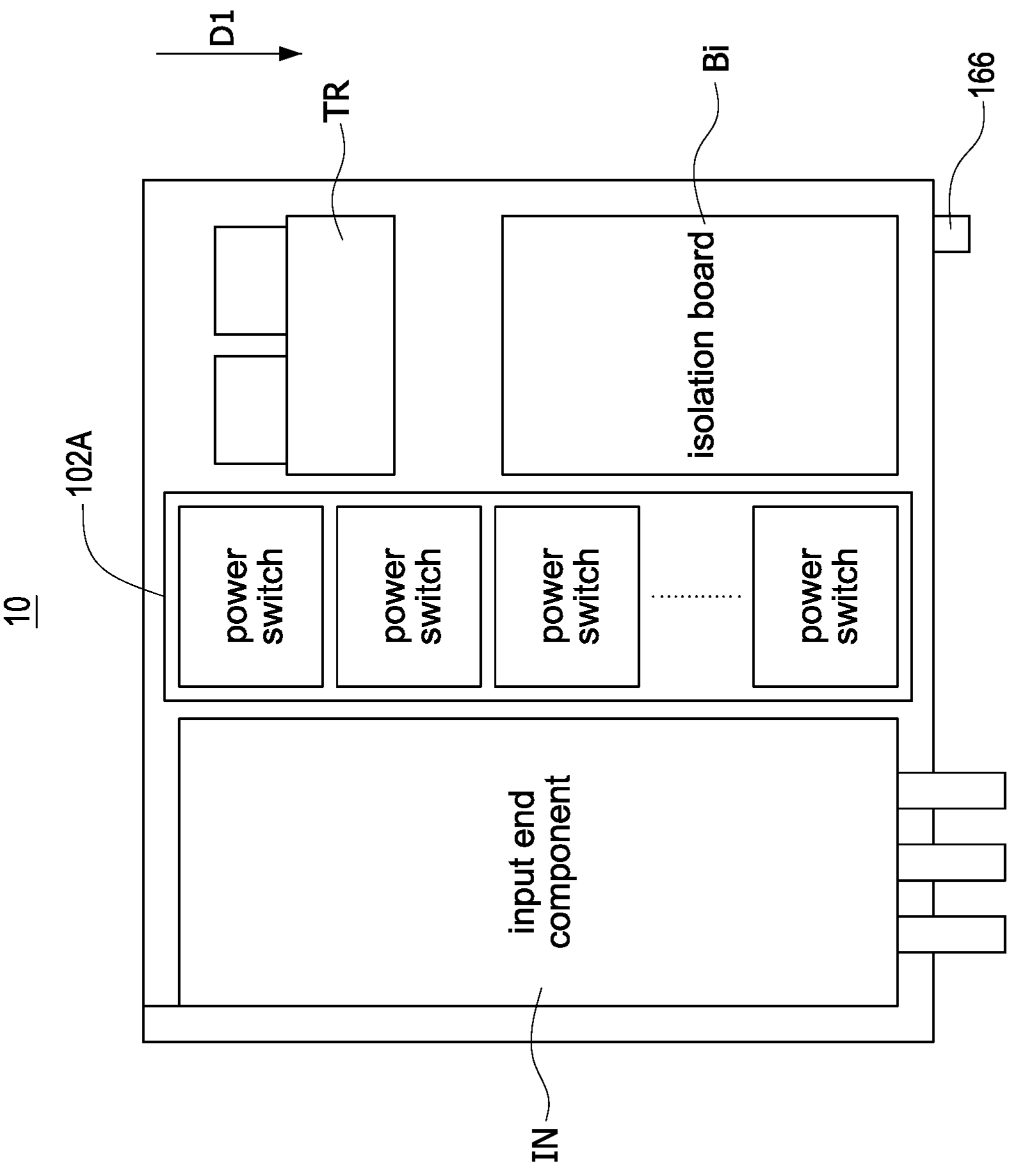
FIG. 8 is a schematic view of the arrangement position of the AC-to-DC conversion module and a second circulation pipeline according to the present disclosure.

Please refer to FIG. 8, which shows a schematic view of the arrangement position of the AC-to-DC conversion module and a second circulation pipeline according to the present disclosure, and also refer to FIG. 2 to FIG. 7. The AC-to-DC conversion module 10 includes an input end component IN, a plurality of power modules 102A, and a transformer TR. The input end component IN includes the filter and the diodes D shown in FIG. 3B for receiving the input power source Pac_3, Pac_1. The power modules 102A may include 2n half-bridge modules 102. The input end component IN is configured on a first side of the power module 102A, i.e., a higher-voltage side of receiving the MV-AC. The transformer TR is configured on a second side (opposite to the first side) of the power module 102A, i.e., a lower-voltage side. The semi-closed inner circulation loop (that is, at least a part of or all of the second circulation pipeline 166) is configured on the lower-voltage side so as to be away from the higher-voltage side of receiving the MV-AC. An isolation board Bi is configured on the surface of the semi-closed inner circulation loop, and the isolation board Bi is used to isolate at least a part of or all of the second circulation pipeline 166 from the airflow flowing through the AC-to-DC conversion modules 10 so as to avoid the alternating hot and cold between the high-temperature coolant Lh and the airflow, causing the high-temperature airflow Ah to contact the lower-temperature pipe wall or the isolation board Bi to condense. In particular, since the isolation board Bi is configured on the lower-voltage side, the demand for insulation is relatively low, and therefore the isolation board Bi may be made of a galvanized steel sheet with relatively low cost.

Figure 9:
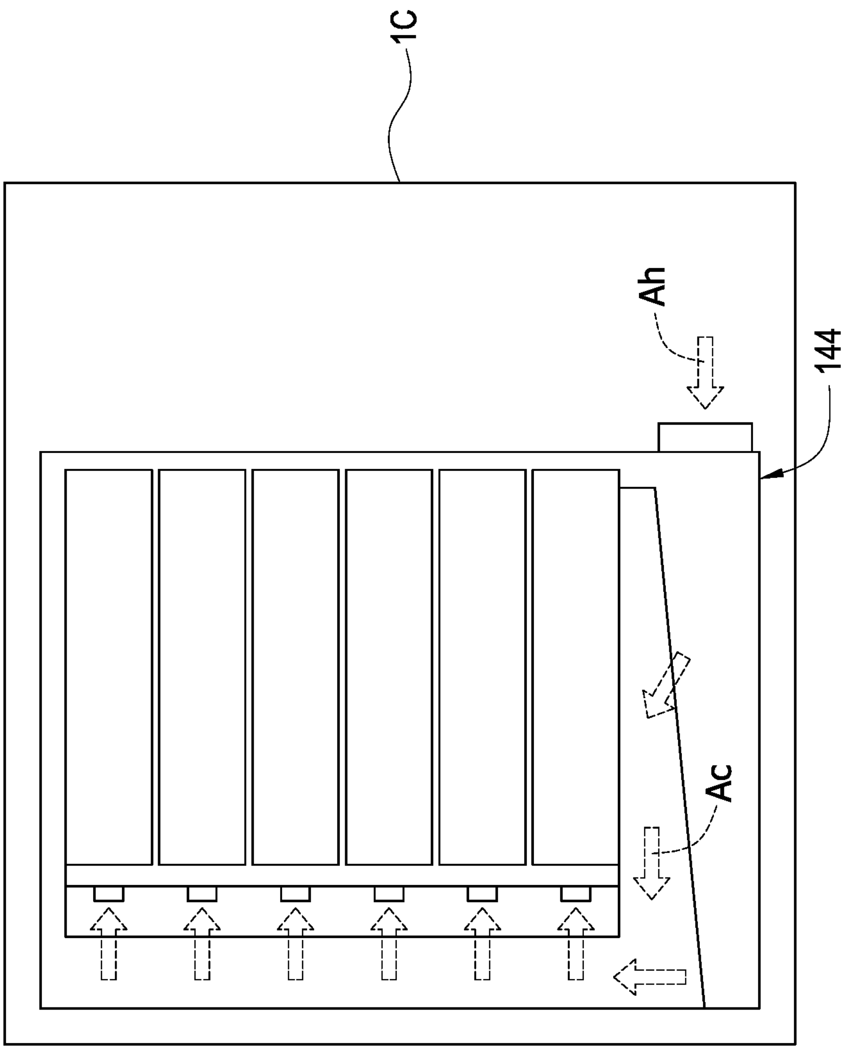
FIG. 9 is a schematic view of the circulation loop of the airflow in a housing according to the present disclosure.

Please refer to FIG. 9, which shows a schematic view of the circulation loop of the airflow in a housing according to the present disclosure, and also refer to FIG. 2 to FIG. 8. In one embodiment, it is a preferred embodiment that the housing 1C is a closeable housing with a cabinet door, which can make the airflow have a better circulation ability. As shown in FIG. 6 and FIG. 8, after the cabinet door is closed, the air cooling component 144 can circulate up and down (or left and right) inside the housing 1C so that the airflow can surround the vertical side (or horizontal side) inside the housing 1C, thereby achieving better heat dissipation effect through air circulation. That is, the air cooling component 144 mainly guides the low-temperature airflow Ac (such as but not limited to 40 degrees Celsius) to the power components so that the low-temperature airflow Ac blows through the power modules 102A to take away the heat (that is, the high-temperature airflow Ah, such as but not limited to 50 degrees Celsius). Afterward, the high-temperature airflow Ah passes through the heat exchanger 182 to exchange heat with the low-temperature coolant Lc (cooling from 50 degrees Celsius to 40 degrees Celsius), and then guides the low-temperature airflow Ac to the power modules 102A (as indicated by the arrow). Therefore, taking FIG. 8 together with FIG. 9 as an example, the airflow blows in the first direction D1.

In one embodiment, since the SST power apparatus 1B includes a plurality of AC-to-DC conversion modules 10, when the heat dissipation system 14 shown in FIG. 7 is applied to FIG. 6, each AC-to-DC conversion module 10 can use independent water cooling components 142 and air cooling components 144 to dissipate heat (that is, include a plurality of water cooling components 142 and air cooling components 144), or a single first circulation loop L1 is matched with a plurality of second circulation loops L2 according to actual requirements.

Although the present disclosure has been described with reference to the preferred embodiment thereof, it will be understood that the present disclosure is not limited to the details thereof. Various substitutions and modifications have been suggested in the foregoing description, and others will occur to those of ordinary skill in the art. Therefore, all such substitutions and modifications are intended to be embraced within the scope of the present disclosure as defined in the appended claims.

What is claimed is:

1. A heat dissipation system, configured to dissipate heat for a power module of an AC-to-DC conversion module, the heat dissipation system comprising:

a chiller, configured to provide a low-temperature coolant, a heat exchanger, coupled to the chiller, and configured to exchange heat between the low-temperature coolant and an airflow flowing through the power module, a first circulation pipeline, coupled to the heat exchanger and the chiller so that the chiller, the heat exchanger, and the first circulation pipeline forming a first circulation loop to circulate the low-temperature coolant, a second circulation pipeline, disposed on one side of the power module to form a second circulation loop, and configured to absorb a heat source generated by the power module by circulating a high-temperature coolant, a first throttle valve, coupled between the first circulation loop and the second circulation loop, and a control module, coupled to the first throttle valve, and configured to open the first throttle valve to introduce the low-temperature coolant into the second circulation loop based on a temperature of the high-temperature coolant being greater than a temperature threshold so as to control the temperature to be less than or equal to the temperature threshold, and wherein when the temperature is less than or equal to the temperature threshold, the control module is configured to control the first throttle valve to close, so as to maintain the high-temperature coolant in the second circulation pipeline within a specific temperature range by controlling whether the first throttle valve is open or closed.

2. The heat dissipation system as claimed in claim 1, further comprising:

a second throttle valve, coupled to the second circulation pipeline and the control module, and a hydraulic pump, coupled to the second circulation pipeline and the control module, wherein the control module is configured to control an opening degree of the second throttle valve and a rotation speed of the hydraulic pump to adjust flow speed and flow amount of the high-temperature coolant.

3. The heat dissipation system as claimed in claim 2, wherein the first throttle valve is an adjustable throttle valve, when the temperature is less than or equal to the temperature threshold, the control module decreases an opening degree of the first throttle valve and the opening degree of the second throttle valve, and when the temperature is greater than the temperature threshold, the control module increases the opening degree of the first throttle valve and the opening degree of the second throttle valve so as to control flow amount of the low-temperature coolant flowing into the second circulation loop.

4. The heat dissipation system as claimed in claim 1, further comprising:

a first thermometer, coupled to the control module and the second circulation pipeline, and configured to sense the temperature, a second thermometer, coupled to the control module, and configured to sense an airflow temperature around the power module, and a hygrometer, coupled to the control module, and configured to sense an airflow humidity around the power module, wherein the control module calculates a dew point temperature based on the airflow temperature and the airflow humidity, and adjusts a temperature range of the high-temperature coolant based on the dew point temperature.

5. The heat dissipation system as claimed in claim 1, wherein the airflow forms a high-temperature airflow and a low-temperature airflow by heat exchange of the heat exchanger; the low-temperature airflow is conducted to the power module to absorb the heat source to generate the high-temperature airflow, and the high-temperature air flow is conducted to the heat exchanger to exchange heat with the low-temperature coolant to generate the low-temperature airflow.

* * * * *